US007667263B2

(12) United States Patent
Luo et al.

(10) Patent No.: US 7,667,263 B2
(45) Date of Patent: Feb. 23, 2010

(54) SEMICONDUCTOR STRUCTURE INCLUDING DOPED SILICON CARBON LINER LAYER AND METHOD FOR FABRICATION THEREOF

(75) Inventors: Zhijiong Luo, Carmel, NY (US); Yaocheng Liu, Elmsford, NY (US)

(73) Assignee: International Business Machines Corporation, Armonk, NY (US)

( * ) Notice: Subject to any disclaimer, the term of this patent is extended or adjusted under 35 U.S.C. 154(b) by 177 days.

(21) Appl. No.: 11/672,109

(22) Filed: Feb. 7, 2007

(65) Prior Publication Data

US 2008/0185636 A1 Aug. 7, 2008

(51) Int. Cl.
*H01L 21/336* (2006.01)

(52) U.S. Cl. ....................... 257/327; 257/288; 257/374; 438/303

(58) Field of Classification Search ................. 257/327, 257/E29.255, E21.409; 438/303
See application file for complete search history.

(56) References Cited

U.S. PATENT DOCUMENTS 6,153,920 A 11/2000 Gossmann et al.
6,818,938 B1 * 11/2004 Naem ......................... 257/302
7,064,399 B2 6/2006 Babcock et al.
2004/0161875 A1 * 8/2004 Chu et al. .................. 438/105
2004/0207013 A1 * 10/2004 Tsuchiya et al. ............ 257/344
2004/0262694 A1 12/2004 Chidambaram
2005/0023520 A1 * 2/2005 Lee et al. ...................... 257/19
2008/0083949 A1 * 4/2008 Zhu et al. .................. 257/347

OTHER PUBLICATIONS

Satoshi Nishikawa et al., "Reduction of transient boron diffusion in preamorphized Si by carbon implantation", Appl. Phys. Lett., 60 (18), May 4, 1992, pp. 2270-72.
Ibrahim Ban et al., "Suppression of Oxidation-Enhanced Boron Diffusion in Silicon by Carbon Implantation and Characterization of MOSFET's with Carbon-Implanted Channels", IEEE Transactions on Electron Devices, vol. 44, No. 9, Sep. 1997, pp. 1544-1551.

* cited by examiner

*Primary Examiner*—Marcos D. Pizarro
*Assistant Examiner*—Sue Tang
(74) *Attorney, Agent, or Firm*—Scully, Scott, Murphy & Presser, P.C.; H. Daniel Schgurmann

(57) ABSTRACT

A semiconductor structure and related method for fabrication thereof includes a liner layer interposed between: (1) a pedestal shaped channel region within a semiconductor substrate; and (2) a source region and a drain region within a semiconductor material layer located upon the liner layer and further laterally separated from the pedestal shaped channel region within the semiconductor substrate. The liner layer comprises an active doped silicon carbon material. The semiconductor material layer may comprises a semiconductor material other than a silicon carbon semiconductor material. The semiconductor material layer may alternatively comprise a silicon carbon semiconductor material having an opposite dopant polarity and lower carbon content in comparison with the liner layer. Due to presence of the silicon carbon material, the liner layer inhibits dopant diffusion therefrom into the pedestal shaped channel region. Electrical performance of a field effect device that uses the pedestal shaped channel region is thus enhanced.

14 Claims, 2 Drawing Sheets

SEMICONDUCTOR STRUCTURE INCLUDING DOPED SILICON CARBON LINER LAYER AND METHOD FOR FABRICATION THEREOF

BACKGROUND

1. Field of the Invention

The invention relates generally to semiconductor structures. More particularly, the invention relates to channel isolation within semiconductor structures.

2. Description of the Related Art

As semiconductor structure and device dimensions decrease, several novel effects become more prominent within semiconductor devices. A particularly detrimental novel effect that is often exhibited within field effect devices is a short channel effect. Short channel effects often arise as gate electrode length (i.e., linewidth) dimensions decrease to less than about 200 nanometers. Short channel effects are generally manifested as a decreased level of control of a gate electrode over a channel region within a field effect device. Such a decreased level of control of the gate electrode over the channel region is typically manifested within the context of compromised electrical operating properties of the field effect device.

It is thus desirable to provide semiconductor structures, and methods for fabrication thereof, that provide for field effect semiconductor devices with inhibited short channel effects.

Various semiconductor structures having desirable properties, and methods for fabrication thereof, are known in the semiconductor fabrication art.

Specific examples of such semiconductor structures, as well as related methods for fabrication thereof, are disclosed within: (1) Nishikawa et al., in "Reduction of transient boron diffusion in preamorphized Si by carbon implantation," Appl. Phys. Lett., 60 (18), 4 May 1992, pp. 2270-72; (2) Ban et al., in "Suppression of Oxidation-Enhanced Boron Diffusion in Silicon by Carbon Implantation and Characterization of MOSFET's with Carbon-Implanted Channels," IEEE Trans. on Electron Devices," 44 (9), September 1997, pp. 1544-51; and (3) Gossmann et al., in U.S. Pat. No. 6,153,920. Each of the foregoing disclosures describes the use of implanted carbon as a boron dopant diffusion inhibitor within particular semiconductor structures.

Semiconductor structure and device dimensions are certain to continue to decrease as semiconductor technology advances. As a result thereof, desirable are semiconductor structures and devices that provide enhanced performance at decreased semiconductor structure and device dimensions.

SUMMARY OF THE INVENTION

The invention comprises a semiconductor structure (and a related method for fabrication thereof) that includes a liner layer comprising an active doped silicon carbon material. The liner layer is interposed between: (1) a pedestal shaped channel region within a semiconductor substrate; and (2) a source region and a drain region located within a semiconductor material layer positioned upon the liner layer and further laterally separated from the pedestal shaped channel region. The semiconductor material layer typically comprises a semiconductor material other than a silicon carbon semiconductor material, but may also include a silicon carbon semiconductor material having an opposite polarity and lower carbon content in comparison with the liner layer.

Typically and preferably, an active dopant within the active doped silicon carbon material comprises a boron dopant, although other active dopants are not excluded from the invention. Due to the use of a silicon carbon material for the liner layer, in comparison with the above enumerated options for the semiconductor material layer, undesirable dopant diffusion into the pedestal shaped channel region is attenuated.

A semiconductor structure in accordance with the invention includes a semiconductor substrate including a gate electrode located over a pedestal shaped channel region within the semiconductor substrate. This particular semiconductor structure also includes a liner layer comprising an active doped silicon carbon material having a first polarity and a first carbon content located upon a sidewall of the pedestal shaped channel region. This particular semiconductor structure also includes a source region and a drain region located at least in part within a semiconductor material layer located upon the liner layer and further laterally separated from the pedestal shaped channel region.

Another particular semiconductor structure in accordance with the invention also includes a semiconductor substrate including a gate electrode located over a pedestal shaped channel region within the semiconductor substrate. This particular other semiconductor structure also includes a liner layer comprising a boron doped silicon carbon material having a first carbon content located upon a sidewall of the pedestal shaped channel region. This particular other semiconductor structure also includes a source region and a drain region located at least in part within a semiconductor material layer located upon the liner layer and further laterally separated from the pedestal shaped channel region.

A method in accordance with the invention includes etching a semiconductor substrate while using at least a gate electrode located over the semiconductor substrate as a mask to form a pedestal shaped channel region within the semiconductor substrate. This particular method also includes forming a liner layer comprising an active doped silicon carbon material having a first polarity and a first carbon content adjoining the pedestal shaped channel region. This particular method also includes forming a semiconductor material layer upon the liner layer and further laterally separated from the pedestal shaped channel region. This particular method also includes forming a source region and a drain region at least in part within the semiconductor material layer.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, that form a material part of this disclosure, wherein.

DESCRIPTION OF THE PREFERRED EMBODIMENT

The invention, which includes a semiconductor structure including a liner layer comprising an active doped silicon carbon material interposed between: (1) a pedestal shaped channel region; and (2) a laterally separated semiconductor material layer including at least in part a source region and a drain region, is understood within the context of the description provided below. The description provided below is understood within the context of the drawings described above. Since the drawings are intended for illustrative purposes, the drawings are not necessarily drawn to scale.

Figure 1:
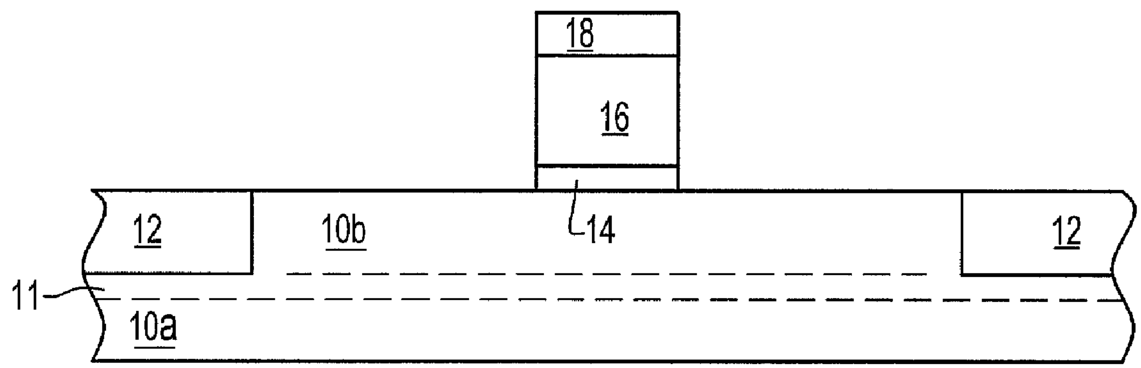
FIG. 1 to FIG. 7 show a series of schematic cross-sectional diagrams illustrating the results of progressive stages in fabricating a semiconductor structure in accordance with an embodiment of the invention that comprises a preferred embodiment of the invention.

FIG. 1 to FIG. 7 show a series of schematic cross-sectional diagrams illustrating the results of progressive stages in fabricating a semiconductor structure in accordance with an embodiment of the invention that comprises a preferred embodiment of the invention. FIG. 1 shows a schematic cross-sectional diagram of the semiconductor structure at an early stage in fabrication thereof in accordance the embodiment.

FIG. 1 shows a base semiconductor substrate 10*a*. A buried dielectric layer 11 is located upon the base semiconductor substrate 10*a*, and a surface semiconductor layer 10*b* is located upon the buried dielectric layer 11. The surface semiconductor layer 10*b* is bounded by a plurality of isolation regions 12. In an aggregate, the base semiconductor substrate 10*a*, the buried dielectric layer 11 and the surface semiconductor layer 10*b* comprise a semiconductor-on-insulator substrate.

The base semiconductor substrate 10*a* may comprise any of several semiconductor materials. Non-limiting examples include silicon, germanium, silicon-germanium alloy, silicon carbon, silicon-germanium carbon alloy and compound (i.e., III-V and II-VI) semiconductor materials. Non-limiting examples of compound semiconductor materials include gallium arsenide, indium arsenide and indium phosphide semiconductor materials.

The optional buried dielectric layer 11 may comprise any of several dielectric materials. Non-limiting examples include oxides, nitrides and oxynitrides, particularly of silicon, but oxides, nitrides and oxynitrides of other elements are not excluded. The buried dielectric layer 11 may comprise a crystalline or a non-crystalline dielectric material, with crystalline dielectric materials being highly preferred. The buried dielectric layer 11 may be formed using any of several methods. Non-limiting examples include ion implantation methods, thermal or plasma oxidation or nitridation methods, chemical vapor deposition methods and physical vapor deposition methods. Typically, the buried dielectric layer 11 comprises an oxide of the semiconductor material from which is comprised the base semiconductor substrate 10*a*.

The surface semiconductor layer 10*b* may comprise any of the several semiconductor materials from which the base semiconductor substrate 10*a* may be comprised. The surface semiconductor layer 10*b* and the base semiconductor substrate 10*a* may comprise either identical or different semiconductor materials with respect to chemical composition, dopant polarity, dopant concentration and crystallographic orientation.

The isolation regions 12 may comprise any of several isolation materials that will typically comprise dielectric isolation materials. Typically, the isolation regions 12 comprise a dielectric isolation material selected from the same group of dielectric isolation materials that may be used for the buried dielectric layer 11. However a method used for fabricating the isolation regions 12 may be different from a method used for fabricating the buried dielectric layer 11. Typically, the isolation regions 12 comprise a silicon oxide or a silicon nitride dielectric material, or a composite or laminate thereof.

The semiconductor-on-insulator substrate portion of the semiconductor structure that is illustrated in FIG. 1 may be fabricated using any of several methods. Non-limiting examples include lamination methods, layer transfer methods and separation by implantation of oxygen (SIMOX) methods.

Although FIG. 1 illustrates an embodiment of the invention within the context of a semiconductor on-insulator substrate comprising the base semiconductor substrate 10*a*, the buried dielectric layer 11 and the surface semiconductor layer 10*b*, neither the instant embodiment nor the invention is so limited. Rather, the instant embodiment and alternative embodiments may also be practiced under certain circumstances (i.e., including preferred circumstances) using a bulk semiconductor substrate (that would otherwise result from absence of the buried dielectric layer 11 under circumstances where the base semiconductor substrate 10*a* and the surface semiconductor layer 10*b* have identical chemical composition and crystallographic orientation). For simplicity, subsequent cross-sectional diagrams within the instant embodiment are illustrated absent the buried dielectric layer 11, and with a single semiconductor substrate 10 (or a derivative thereof that is intended to represent a bulk semiconductor substrate) rather than a base semiconductor substrate 10*a* and a surface semiconductor layer 10*b*.

Alternatively, the embodiment also contemplates use of a hybrid orientation (HOT) substrate. A hybrid orientation substrate has multiple crystallographic orientations within a single semiconductor substrate.

FIG. 1 also shows (in cross-section): (1) a gate dielectric 14 located upon the surface semiconductor layer 10*a*; (2) a gate electrode 16 located upon the gate dielectric 14; and (3) a capping layer 18 located upon the gate electrode 16.

Each of the foregoing layers 14, 16 and 18 may comprise materials and have dimensions that are conventional in the semiconductor fabrication art. Each of the foregoing layers 14, 16 and 18 may also be formed using methods that are conventional in the semiconductor fabrication art.

The gate dielectric 14 may comprise conventional dielectric materials such as oxides, nitrides and oxynitrides of silicon that have a dielectric constant from about 4 (i.e., typically a silicon oxide) to about 8 (i.e., typically a silicon nitride), measured in vacuum. Alternatively, the gate dielectric 14 may comprise generally higher dielectric constant dielectric materials having a dielectric constant from about 8 to at least about 100. Such higher dielectric constant dielectric materials may include, but are not limited to hafnium oxides, hafnium silicates, zirconium oxides, lanthanum oxides, titanium oxides, barium-strontium-titantates (BSTs) and lead-zirconate-titanates (PZTs). The gate dielectric 14 may be formed using any of several methods that are appropriate to its material of composition. Non limiting examples include thermal or plasma oxidation or nitridation methods, chemical vapor deposition methods (including atomic layer deposition methods) and physical vapor deposition methods. Typically, the gate dielectric 14 comprises a thermal silicon oxide dielectric material that has a thickness from about 5 to about 200 angstroms.

The gate electrode 16 may comprise materials including but not limited to certain metals, metal alloys, metal nitrides and metal silicides, as well as laminates thereof and composites thereof. The gate electrode 16 may also comprise doped polysilicon and polysilicon-germanium alloy materials (i.e., having a dopant concentration from about 1e18 to about 1e22 dopant atoms per cubic centimeter) and polycide materials (doped polysilicon/metal silicide stack materials). Similarly, the foregoing materials may also be formed using any of several methods. Non-limiting examples include salicide methods, chemical vapor deposition methods and physical vapor deposition methods, such as, but not limited to evaporative methods and sputtering methods. Typically, the gate electrode 16 comprises a doped polysilicon material that has a thickness from about 50 to about 5000 angstroms.

The capping layer 18 comprises a capping material that in turn typically comprises a hard mask material. Dielectric hard mask materials are most common but by no means limit the instant embodiment or the invention. Non-limiting examples of hard mask materials include oxides, nitrides and oxynitrides of silicon. Oxides, nitrides and oxynitrides of other elements are not excluded. The capping material may be formed using any of several methods that are conventional in the semiconductor fabrication art. Non-limiting examples include chemical vapor deposition methods and physical vapor deposition methods. Typically, the capping layer 18 comprises a silicon nitride capping material that has a thickness from about 50 to about 1000 angstroms.

Figure 2:
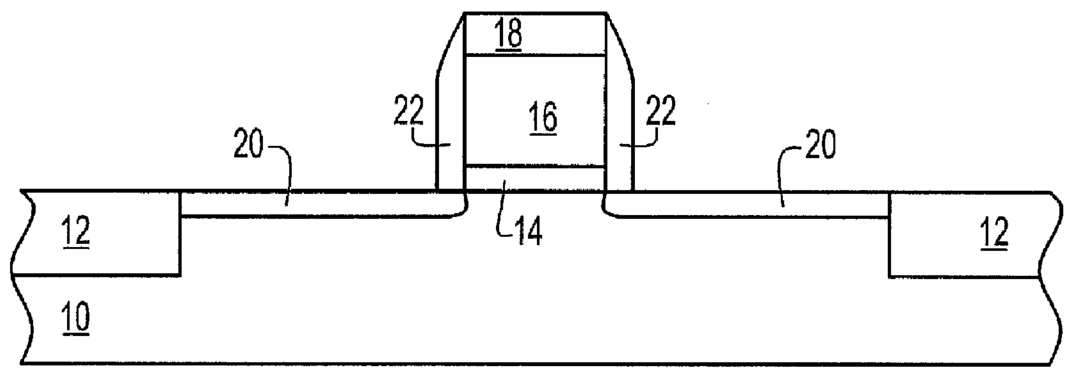

FIG. 2 shows a plurality of first spacers 22 located adjacent and adjoining opposite sidewalls (i.e., a plurality of spacer layers in cross-sectional view but a single spacer layer in plan view) of the gate dielectric 14, gate electrode 16 and capping layer 18. FIG. 2 also shows a plurality of extension regions 20 located within the semiconductor substrate 10 and separated by the gate electrode 16, beneath which is a channel region that also separates the extension regions 20.

Within the instant embodiment, either the first spacers 22 or the extension regions 20 may be formed first, but typically the first spacers 22 will be formed first.

The first spacers 22 typically comprise a dielectric spacer material. Similarly with other dielectric structures within the instant embodiment, candidate dielectric spacer materials again include oxides, nitrides and oxynitrides of silicon. Also again, oxides, nitrides and oxynitrides of other elements are not excluded. The first spacers 22 are formed using a blanket layer deposition and anisotropic etchback method that uses an anisotropic etching plasma for etching purposes. Typically, the first spacers 22 comprise a different dielectric material than the capping layer 18. Typically, the first spacers 22 comprise a silicon oxide material when the capping layer 18 comprises a silicon nitride material.

The extension regions 20 comprise an n dopant or a p dopant appropriate to a polarity or conductivity type of a field effect transistor desired to be fabricated incident to further processing of the semiconductor structure of FIG. 2. Non-limiting examples of n dopants include arsenic dopants, phosphorus dopants, halides thereof and hydrides thereof. Non-limiting examples of p dopants include boron dopants, halides thereof and hydrides thereof. Any of the foregoing dopants may be used for forming the extension regions 20 and other doped regions described below within the instant embodiment. Less conventional alternative dopants are not excluded. As is noted above, the extension regions 20 may be formed either before or after forming the first spacers 22. Thus, the extension regions 20 are formed using an ion implant method that uses at least the gate electrode 16 as a mask. Typically, the extension regions 20 are formed to a depth from about 10 to about 500 angstroms within the semiconductor substrate 10 and with a concentration from about 1e18 to about 1e22 dopant atoms per cubic centimeter within the semiconductor substrate 10. Within the context of further disclosure below, the extension regions 20 will typically comprise an n dopant for fabrication of an n field effect transistor.

Figure 3:
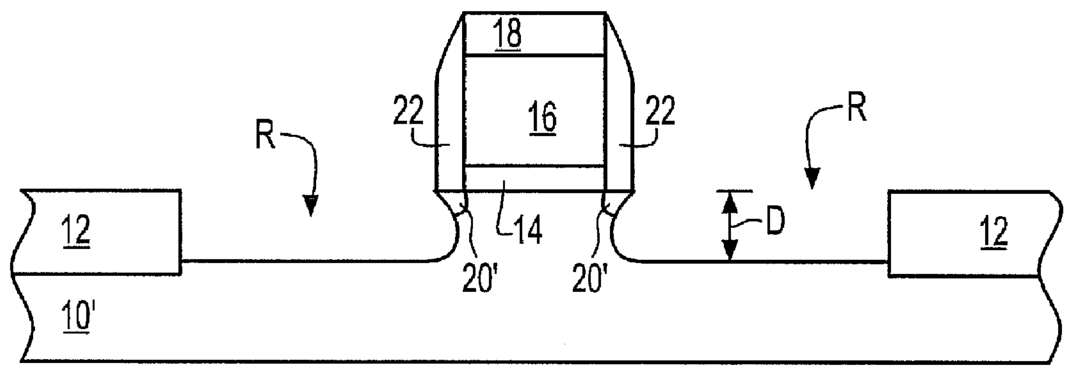

FIG. 3 shows the results of etching the semiconductor substrate 10, while using the gate electrode 16 and the first spacers 22 as a mask, to form an etched semiconductor substrate 10' that includes a pedestal shaped channel region P beneath the gate electrode 16, and including a plurality of extension regions 20' that derive from the extension regions 20. The pedestal shaped channel region P is separated from the isolation regions 12 by a plurality of recesses R each of which has a depth D. Typically, a maximum depth D of the recesses R is from about 100 to about 1000 angstroms within the etched semiconductor substrate 10'.

The semiconductor substrate 10 that is illustrated in FIG. 2 may be etched to provide the semiconductor substrate 10' that is illustrated in FIG. 3 while using etch methods and materials that are otherwise generally conventional in the semiconductor fabrication art. Although not specifically limiting the embodiment or the invention, such etch methods will typically be isotropic etch methods. Non-limiting examples of such isotropic etch methods include wet chemical etch methods and certain dry plasma etch methods that may be undertaken at elevated reactor chamber pressures. Isotropic wet chemical etch methods will often use mixtures of aqueous acids such as nitric, hydrofluoric and acetic acids, at room temperature or above. Isotropic dry plasma etch methods will typically employ etchant gas compositions that include chlorine and/or fluorine containing etchant gases. As an alternative, the foregoing etching may also be provided by using a combination of: (1) an anisotropic dry plasma etch method; followed by (2) an isotropic dry plasma etch method or an isotropic wet chemical etch method.

Figure 4:
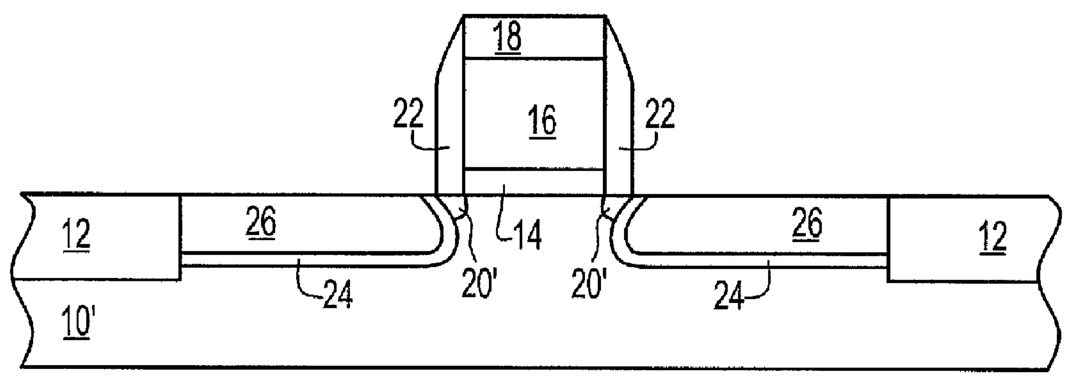

FIG. 4 shows the results of backfilling the recesses R that are illustrated within the schematic cross-sectional diagram of FIG. 3 first with a plurality of liner layers 24 that conformally incompletely fill the recesses R, and then with a plurality of semiconductor material layers 26 that do completely fill the recesses R. The plurality of semiconductor material layers 26 is intended to provide a surface nominally coplanar with the isolation regions 12.

Within the instant embodiment, the liner layers 24 comprise an active doped silicon carbon material and the semiconductor material layers 26 preferably comprise a semiconductor material other than a silicon carbon semiconductor material. Alternatively, the semiconductor material layers 26 may also comprise a particular silicon carbon semiconductor material with a lower carbon content than the liner layers 24. The particular silicon carbon semiconductor material with the lower carbon content may be deposited undoped and subsequently doped, or deposited doped with a dopant having opposite polarity as the dopant used for forming the liner layers 24. More particularly, the semiconductor material layers 26 preferably comprise a silicon semiconductor material.

The instant embodiment contemplates in particular a boron active dopant within the liner layers 24. Other active dopants including both n dopants (i.e., arsenic and phosphorus dopants, and derivatives thereof, such as halide derivatives and hydride derivatives) and p dopants (boron dopants and derivatives thereof, such as halide derivatives and hydride derivatives) are not excluded. The embodiment and the invention also contemplate that: (1) a silicon carbon material from which is comprised the liner layers 24; and (2) the foregoing semiconductor materials from which may be comprised the semiconductor material layers 26, are both deposited epitaxially and sequentially to preserve and replicate the crystallographic orientation of the semiconductor substrate 10'. Such an epitaxial chemical vapor deposition method may use source materials and deposition conditions that are otherwise generally conventional in the semiconductor fabrication art.

Typically, the liner layers 24 are formed to a thickness from about 20 to about 500 angstroms and the semiconductor material layers 26 are formed to a thickness from about 50 to about 500 angstroms that nominally planarizes the semiconductor structure that is illustrated in FIG. 4 with respect to the gate dielectric 14 or isolation regions 12. Typically, the liner layers 24 have a Si:C atomic ratio from about 200:1 to about 2:1. Typically, the liner layers 24 have an active dopant concentration from about 1e15 to about 1e22 dopant atoms per cubic centimeter. Although neither a specific limitation nor a requirement of the embodiment, the semiconductor material layers 26 may comprise an undoped semiconductor material, or in an alternative a doped semiconductor material having a dopant concentration from about 1e15 to about 1e22 dopant atoms per cubic centimeter.

Figure 5:
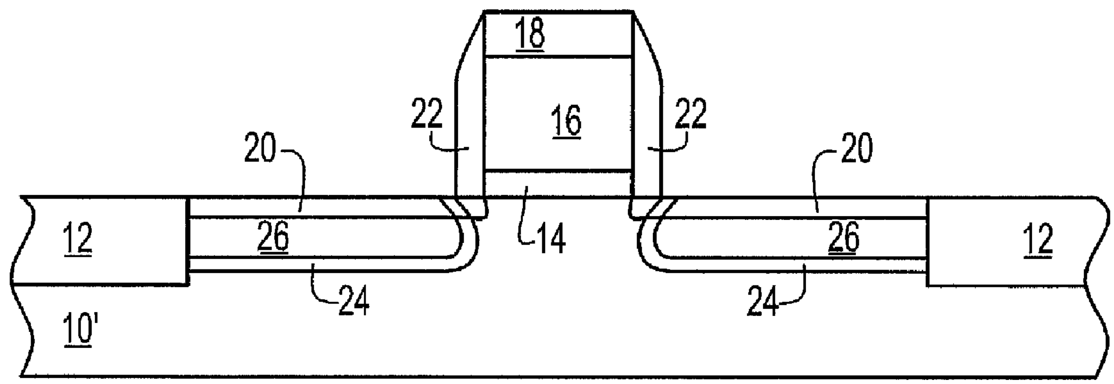

FIG. 5 shows the results of reimplanting the extension regions 20' to again reform the extension regions 20 that are originally illustrated in FIG. 2. As is illustrated within the context of FIG. 5, and also within subsequent cross-sectional diagrams, the extension regions 20 are in particular reimplanted to provide continuity through the liner layers 24.

The reimplanting of the extension regions 20' to form the extension regions 20 is preferably effected using an ion implantation method that uses a dopant ion and ion implantation conditions analogous, equivalent or identical to the dopant ion and ion implantation conditions that are used for forming the extension regions 20 that are originally illustrated within FIG. 2.

Figure 6:
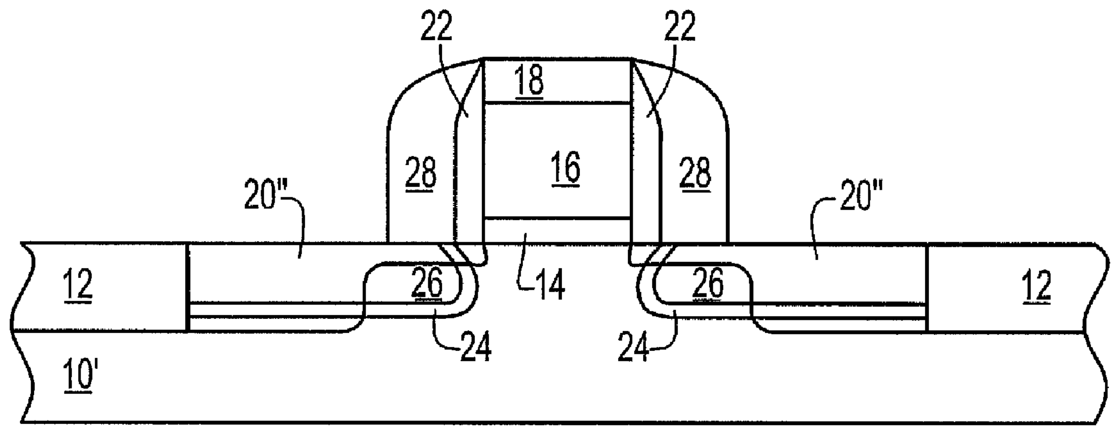

FIG. 6 first shows the results of forming a plurality of second spacers 28 located upon the plurality of first spacers 22. The plurality of second spacers 28 may comprise materials, have dimensions and be formed using methods that are analogous, equivalent or identical to the materials, dimensions and methods that are used for forming the plurality of first spacers 22. Typically, the plurality of second spacers 28 and the plurality of first spacers 22 are both formed of a silicon oxide material, although neither the embodiment nor the invention is so limited.

FIG. 6 also shows a plurality of source regions and drain regions 20" located at least in part within the plurality of semiconductor material layers 26. The plurality of source regions and drain regions 20" is implanted so as to incorporate the plurality of extension regions 20. The plurality of source regions and drain regions 20" is implanted while using the gate electrode 16, the first spacers 22 and the second spacers 28 as a mask. Typically, the polarity of the source regions and drain regions 20" and the polarity of extension regions 20 are identical, although the chemical compositions of individual dopant species used for forming the extension regions 20 and the source regions and drain regions 20" may not necessarily be identical. Typically, the plurality of source regions and drain regions 20" is implanted to provide a dopant concentration from about 1e16 to about 1e23 dopant atoms per cubic centimeter within the larger contact region portions of the source regions and drain regions 20" that extend beneath the liner layers 24. While FIG. 6 illustrates the source regions and drain regions 20" as extending below the liner layers 24, such a relative disposition of the source regions and drain regions 20" and the liner layers 24 is not a limitation of the embodiment or the invention. Rather, the liner layers 24 may alternatively extend below the source regions and drain regions 20".

Figure 7:
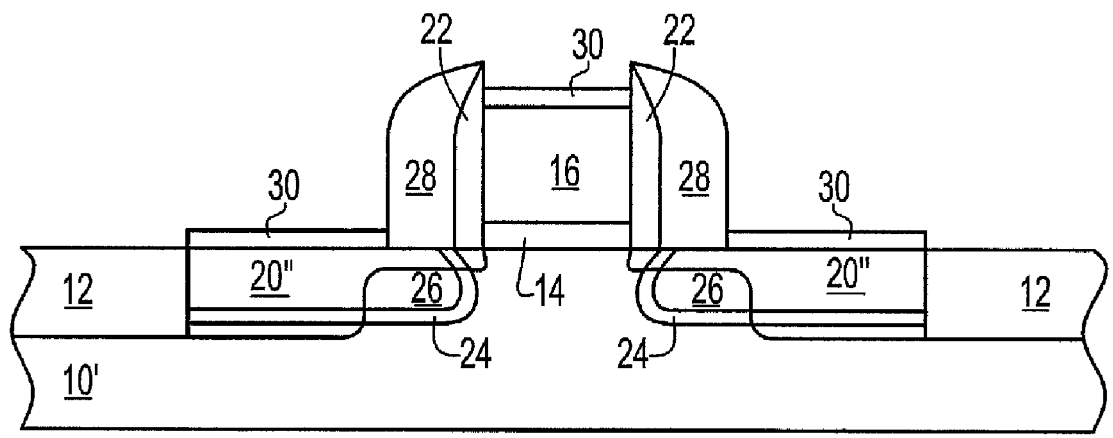

FIG. 7 first shows the results of stripping the capping layer 18 from the gate electrode 16. The capping layer 18 may be stripped from the gate electrode 16 while using stripping methods and materials that are conventional in the semiconductor fabrication art. Non-limiting examples include wet chemical stripping methods and materials, and dry plasma stripping methods and materials. When the capping layer 18 preferably comprises a silicon nitride capping material, and both the first spacers 22 and the second spacers 28 comprise a silicon oxide material, the capping layer 18 may be stripped selectively with respect to the first spacers 22 and the second spacers 28 while using a wet chemical stripping method that uses an aqueous phosphoric acid solution at an elevated temperature.

FIG. 7 also shows a plurality of silicide layers 30 located upon exposed silicon containing surfaces including the source regions and drain regions 20" and the gate electrode 16. The silicide layers 30 may comprise any of several silicide forming metals. Non-limiting examples of candidate silicide forming metals include nickel, cobalt, titanium, tungsten, erbium, ytterbium, platinum and vanadium silicide forming metals. Nickel and cobalt silicide forming metals are particularly common. Others of the above enumerated silicide forming metals are less common. Typically, the silicide layers 30 are formed using a salicide method. The salicide method includes: (1) forming a blanket silicide forming metal layer upon the semiconductor structure of FIG. 7; (2) thermally annealing the blanket silicide forming metal layer with silicon surfaces which it contacts to selectively form the silicide layers 30 while leaving unreacted metal silicide forming metal layers on, for example, the spacers 28 and the isolation regions 12; and (3) selectively stripping unreacted portions of the silicide forming metal layers from, for example, the spacers 28 and the isolation regions 12. Typically, the silicide layers 30 comprise a nickel silicide material or a cobalt silicide material.

FIG. 7 shows a semiconductor structure in accordance with a preferred embodiment of the invention. The semiconductor structure includes a field effect transistor structure that includes a liner layer 24 interposed between: (1) a pedestal shaped channel region beneath a gate electrode 16; and (2) a semiconductor material layer 26 within which is located at least in-part a source regions and drain region 20". The liner layer 24 comprises an active doped silicon carbon material having a first polarity and a first carbon content, and the semiconductor material layer 26 comprises a semiconductor material other than the active doped silicon carbon semiconductor material having the first polarity and the first carbon concentration. The semiconductor material layer 26 may thus comprise a silicon carbon semiconductor material having a lower carbon concentration and an opposite dopant polarity in comparison with the liner layer. Typically, the semiconductor material layer 26 comprises a silicon semiconductor material.

Since the liner layer 24 comprises a silicon carbon material, diffusion of an active dopant, such as an active boron dopant, is inhibited within the liner layer 24. Such an inhibited diffusion of an active dopant, such as in particular an active boron dopant, within the liner layer 24 is desirable since such inhibited diffusion of an active dopant maintains a desirable dopant concentration profile within the liner layer 24 and also inhibits active dopant diffusion into the pedestal shaped channel region P or surrounding source regions and drain regions 20". In turn, such inhibited active dopant diffusion into the pedestal shaped channel region provides for enhanced and uniform electrical performance (i.e., including short channel effect control) of the field effect transistor whose schematic cross-sectional diagram is illustrated in FIG. 7.

The preferred embodiment of the invention is illustrative of the invention rather than limiting of the invention. Revisions and modifications may be made to methods, materials, structures and dimensions of a semiconductor structure in accordance with the preferred embodiment of the invention, while still fabricating a semiconductor structure in accordance with the invention, further in accordance with the accompanying claims.

What is claimed is:

1. A semiconductor structure comprising:

a semiconductor substrate including a pedestal region, in which adjacent the pedestal region the semiconductor substrate further comprises recessed surfaces, the recessed surfaces being vertically offset from an upper surface of the pedestal region, wherein the pedestal regions contains a channel region therein;

a gate electrode present over the pedestal region;

a liner layer comprising an active doped silicon carbide material having a first dopant polarity and a first carbon content located upon a sidewall of the pedestal region and the recessed surfaces of the semiconductor substrate; and a source/drain region located at least in part within a semiconductor material layer located upon the liner layer and further laterally separated from the pedestal region, wherein deep source and drain regions are present outside the pedestal region of the semiconductor substrate.

2. The semiconductor structure of claim 1 wherein the semiconductor substrate comprises a bulk semiconductor substrate.

3. The semiconductor substrate of claim 1 wherein the semiconductor substrate comprises a semiconductor-on-insulator substrate.

4. The semiconductor structure of claim 1 wherein the liner layer comprises an active dopant selected from the group consisting of boron, arsenic, phosphorus and indium active dopants.

5. The semiconductor structure of claim 1 wherein:

the pedestal region has a curved sidewall; and the liner layer is also located upon a floor of a recess within the semiconductor substrate adjoining the pedestal region.

6. The semiconductor structure of claim 1 wherein the liner layer has:

an active dopant concentration from about 1e15 to about 1e22 dopant atoms per cubic centimeter; and a silicon:carbon atomic ratio from about 200:1 to about 2:1.

7. The semiconductor structure of claim 1 wherein the semiconductor material layer comprises one of:

a semiconductor material other than a silicon carbide semiconductor material; and a silicon carbide semiconductor material comprising a second polarity different than the first polarity and a second carbon content less than the first carbon content.

8. A method for fabricating a semiconductor structure comprising:

etching a semiconductor substrate while using at least a gate electrode located over the semiconductor substrate as a mask to form a pedestal shaped channel region within the semiconductor substrate;

forming a liner layer comprising an active doped silicon carbide material adjoining a sidewall of the pedestal shaped channel region;

forming a semiconductor material layer upon the liner layer and further laterally separated from the pedestal shaped channel region; and forming a source/drain region at least in part within the semiconductor material layer, wherein deep source and drain regions are present outside the pedestal shaped channel region of the semiconductor substrate.

9. The method of claim 8 wherein the etching the semiconductor substrate uses an isotropic etch to provide a curved sidewall of the pedestal shaped channel region.

10. The method of claim 8 wherein the forming the liner layer also forms the liner layer upon a floor of a recess within the semiconductor substrate adjoining the pedestal shaped channel region.

11. The method of claim 8 wherein the forming the liner layer and the forming the semiconductor material layer use a sequential epitaxial method.

12. The method of claim 8 wherein the forming the source/drain region uses the gate electrode and at least two spacer layers as mask.

13. The method of claim 8 further comprising forming an extension region within the semiconductor substrate.

14. The method of claim 13 wherein the forming the extension region is undertaken both before the etching the semiconductor substrate and after the forming the semiconductor material layer.

* * * * *